United States Patent [19]
Gelfenbain

[11] Patent Number: 5,831,560
[45] Date of Patent: Nov. 3, 1998

[54] S-TABLE APPROACH TO DATA TRANSLATION

[75] Inventor: Alexander D. Gelfenbain, Mountain View, Calif.

[73] Assignee: Sun Microsystems, Inc., Palo Alto, Calif.

[21] Appl. No.: 718,201

[22] Filed: Sep. 20, 1996

[51] Int. Cl.⁶ .................................................. H03M 7/38
[52] U.S. Cl. ........................... 341/106; 341/51; 395/752
[58] Field of Search .............................. 341/106, 51, 59; 395/752, 758, 416

[56] References Cited

U.S. PATENT DOCUMENTS

| | | | |
|---|---|---|---|
| 5,253,325 | 10/1993 | Clark | 395/2 |
| 5,309,566 | 5/1994 | Larson | 395/275 |
| 5,594,919 | 1/1997 | Turkowski | 395/800 |
| 5,610,603 | 3/1997 | Plambeck | 341/51 |

*Primary Examiner*—Marc S. Hoff
*Assistant Examiner*—Peguy JeanPierre
*Attorney, Agent, or Firm*—Graham & James LLP

[57] ABSTRACT

The present invention is a method and apparatus for translating an input character from a source codeset to a target codeset. Structurally, the present invention includes a list of translation tables each having one or more entries. Each entry in a translation table defines a translation from a character in the source codeset to a character in the target codeset. Each translation table also includes an entry condition function and an input normalization function. To translate an input character in the source codeset to the target codeset, the list of translation tables is traversed until an entry condition is found which returns a boolean value of true when called with the input character is passed as a parameter. Then input character is then passed to the input normalization function which returns the index or position of the translation for the input character in the translation table. The contents of the translation table, at the index, is then returned as the translation of the input character.

19 Claims, 5 Drawing Sheets

S-TABLE APPROACH TO DATA TRANSLATION

RELATED APPLICATIONS

U.S. application Ser. No. 08/710709 entitled "Dynamic Codeset Translation Environment" of Alexander Gelfenbain, the disclosure of which is incorporated in this application by reference.

FIELD OF THE INVENTION

The present invention pertains generally to the translation of data within data processing systems. More specifically, the present invention is a method and apparatus for translating single and multi-byte characters between a source codeset and a target codeset.

BACKGROUND OF THE INVENTION

Translation of data is a common and well know procedure within computers of many types. For example, computer systems routinely translate between characters represented in ASCII and characters represented in EBCDIC. In many of these cases a relatively small codeset is involved. As a result, the translation may be performed by allocating a relatively small table which maps characters in the source codeset to equivalent characters in the target codeset. For example, the set of ASCII characters has only 256 individual characters. This allows any ASCII character to be represented in a single eight bit byte. It also allow translation tables to be constructed to translate between ASCII and other eight-bit codesets using a single table of 256 eight-bit bytes.

Increasingly, translations between differing multi-byte codesets are required. This is, of course, well known in the case of the Japanese character set, Kanji, which has thousands of individual characters. The large number of characters in codesets, such as Kanji, require that each character be represented by a sequence of memory bytes. In fact, Kanji characters are generally represented using a two byte sequence which yields a total of 65,536 possible characters.

One result in the use of multi-byte character sets is a rapid increase in the size of tables required to translate between character sets. For example, to translate between two two-byte character sets, a translation table would have 65,536 two-byte entries. Such a table would have a total of 131,072 (or 128K) bytes. Similarly, if four-byte characters were used, each translation table would require a total of sixteen giga-bytes.

The use of translation tables for translation between multi-byte character sets is problematic in terms of the amount of memory required for each translation table. In many systems, the problem of space inefficiency is magnified by the haphazard way in which translation is performed within the system. More specifically, in many systems it is often the case that each software process that requires a particular translation will have its own dedicated translation tables. This increases the memory required by the system due to the multiple instances of each translation table. Additionally, programming effort is wasted as the translation table is re-implemented for each new software process.

SUMMARY OF THE INVENTION

The present invention is a method and apparatus for translating an input character from a source codeset to a corresponding character in a target codeset. More specifically, for the purposes of the present invention, a codeset is assumed to be a series of one or more characters each representable in a fixed number of memory bytes. Each character is assumed to have an ordinal value which corresponds to the position of the character within the sequence of characters which make up the codeset. Source and target codesets may have common characters, or characters which are the same and which have the same ordinal value in the source and target codesets. Characters which are not common characters, or characters which are different in the source and target codesets, or character which are the same but which have different ordinal values in the source and target codesets, are known as distinct characters. For the purposes of the present invention, a source codeset is assumed to include one or more sequences of distinct characters each separated by a sequence of one or more common characters.

In the present invention, a translation table is provided for each sequence of distinct characters in a source codeset. Each translation table corresponds to a particular sequence of distinct characters and includes one entry for each character in the corresponding sequence. Each translation table entry contains a translation of one of the characters in the corresponding sequence. Overall, the entries in a translation table are arranged so that the translated characters appear in the same order as the un-translated characters in the corresponding sequence. The un-translation tables are included in a list of translation tables, allowing the translation tables to be accessed in a sequential traversal.

Each translation table in the list of translation tables has an associated entry condition function and an associated input normalization function. Each of these two functions accepts an input character, from the source codeset, as a parameter. The entry condition function returns a boolean value of true if a translation exists in the translation table for the input character. If, on the other hand, no translation is contained within that particular table, the entry condition function returns a boolean value of false. The input normalization function transforms the input character into the index of the translation table entry where a translation for the input character may be found.

Translation of an input character, from the source codeset to the target codeset, begins by traversing the list of translation tables. At each translation table encountered during the traversal, the entry condition function associated with the translation table is called. If the entry condition function returns a boolean value of false, the traversal continues. If, however, a boolean value of true is returned, the traversal is stopped. The traversal also stops, of course, if the end of the translation table list is reached.

Assuming that the traversal of the translation table list has stopped because an entry condition function has returned a value of true, the translation may continue by calling the input normalization function associated with the last translation table accessed during the traversal. The input normalization function returns the index, or position within the translation table, of the entry which contains the translation of the input character. Using this index, the correct entry within the translation table may be accessed as the translation for the input character.

Alternatively, if the traversal has stopped because the end of the translation table list has been reached, it may be assumed that the input character is a common character (recall that translation tables are not provided for common characters). Therefore, since the input character is the same in both the source and target codesets, the input character is returned as the result of the translation.

In accordance with the purpose of the invention, as embodied and broadly described herein, the invention is a method for providing a translation system between a source codeset and a target codeset stored in a memory of a computer system, the method comprising the steps of: locating a sequence of characters within the source codeset, each character in the sequence having a corresponding translated character in the target codeset with the character and the translated character being distinct, providing a translation table having one entry for each character in the sequence, each entry containing a translated character which corresponds to a character in the sequence with the entries being arranged in the same order as the characters in the sequence, and providing an input normalization function for the translation table, the input normalization function accepting an input character from the source codeset as a parameter, the input normalization function returning the index within the translation table of the entry which contains the translation of the input character.

In further accordance with the purpose of this invention, as embodied and broadly described herein, the invention is A computer program product comprising: a computer usable medium having computer readable code embodied therein for translating an input character from a source codeset to a target codeset, the computer program product comprising: computer readable program code devices configured as a list of translation tables, each translation table having one or more entries, each entry mapping one character in the source codeset to the translated character in the target codeset, computer readable program code devices configured to return a value of boolean true if a translation table includes an entry containing a translation for the input character, and computer readable program code devices configured to generate the index of a translation table entry which contains a translation for the input character.

Objects and advantages of the invention will be set forth in part in the description which follows and in part will be obvious from the description or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF THE PREFERRED EMBODEMENTS

Reference will now be made in detail to the preferred embodiments of the invention, examples of which are illustrated in the accompanying drawings. Wherever possible, the same reference numbers will be used throughout the drawings to refer to the same or like parts.

Figure 1:
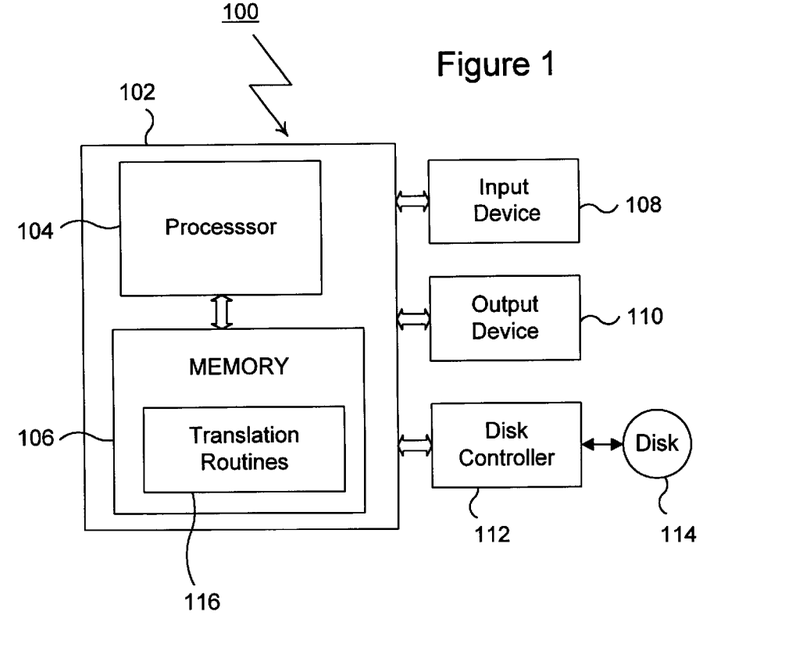
FIG. 1 is a block diagram of a data processing system in accordance with a preferred embodiment of the present invention.

The present invention is a method and apparatus for translating an input character from a source codeset to a target codeset. In FIG. 1, a data processing system 100 is shown as a representative environment for the present invention. Structurally, the data processing system 100 includes a host computer 102 which, in turn, includes a central processing unit, or PROCESSOR 104, and memory 106. An input device 108 and an output device 110 are connected to the host computer 102 and represent a wide range of varying I/O devices such as disk drives, keyboards, modems, network adapters, printers and displays. FIG. 1 also shows that computer system 100 includes a disk controller 112 and a disk drive 114. Finally, a set of translation routines are shown to be resident in memory 106.

Figure 2:
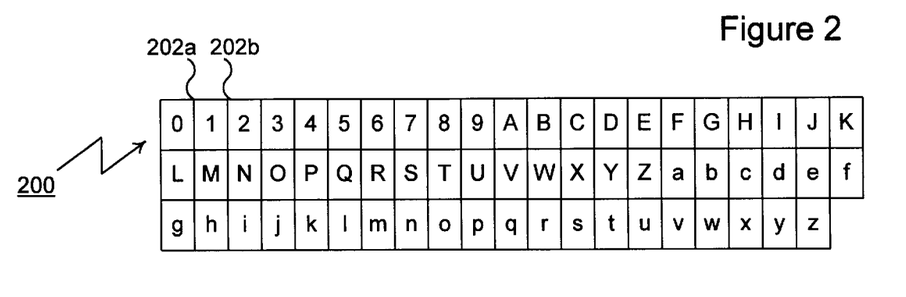
FIG. 2 is a drawing of an idealized source codeset.

FIG. 2 shows a simplified source code set generally designated 200. Source codeset 200 includes a number of characters of which characters 202a and 202b are representative. Each character 202 in source codeset 200 has a human readable representation, such as '0' or 'a'. Each character 202 also has an ordinal value defined by the position of the character in the source codeset 202. For example, the ordinal value of '0' is zero and the ordinal value of 'A' is ten. In general, it should be appreciated that source codeset 200 is intended to be used for the purposes of illustration and that the present invention is intended to be usable in combination with a wide range of source codesets of varying complexity. In particular, the present invention is specifically intended to be used in combination with multi-byte codesets.

Figure 3:
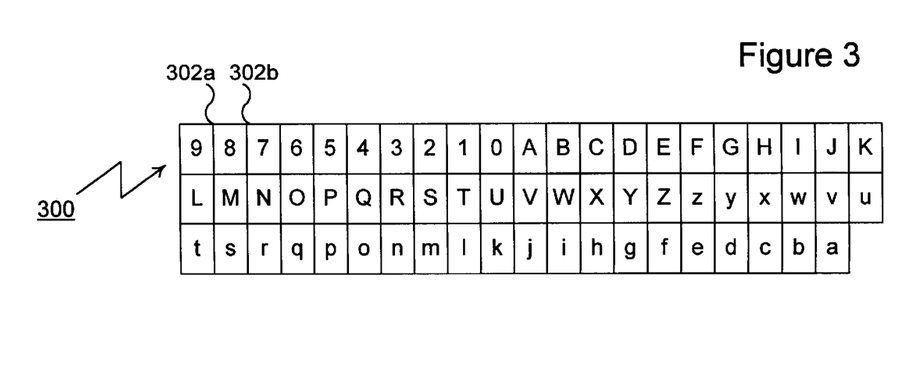
FIG. 3 is a drawing of an idealized target codeset.

In FIG. 3, a simplified target code set is shown and generally designated 300. Target codeset 300, which is intended for the purposes of illustration only, is generally similar to source codeset 200. Importantly, however, source codeset 200 and target codeset 300 differ in several important aspects. For example, the decimal digits 0 through 9 which form the initial portion of source codeset 200 are reversed in order for target codeset 300. Similarly, the characters of the lowercase alphabet which form the final portion of source codeset 200 are, likewise, reversed in order for target codeset 300.

For the purposes of the present invention, source codeset 200 and target codeset 300 are used to define two types of character sequences: common sequences and distinct sequences. More specifically, for source codeset 200 and target codeset 300 the characters of the uppercase alphabet form a common sequence. The sequence is common because the same characters are included in both the source codeset 200 and the target codeset 300 and because the characters of the uppercase alphabet have the same ordinal values within the source codeset and target codeset 300. A sequence which is not common is distinct, meaning that the sequence includes different characters in the source and target codeset, or, as in the case of source codeset 200 and target codeset 300, the same characters are included but the characters have different ordinal values in the source codeset 200 and target codeset 300.

Figure 4:
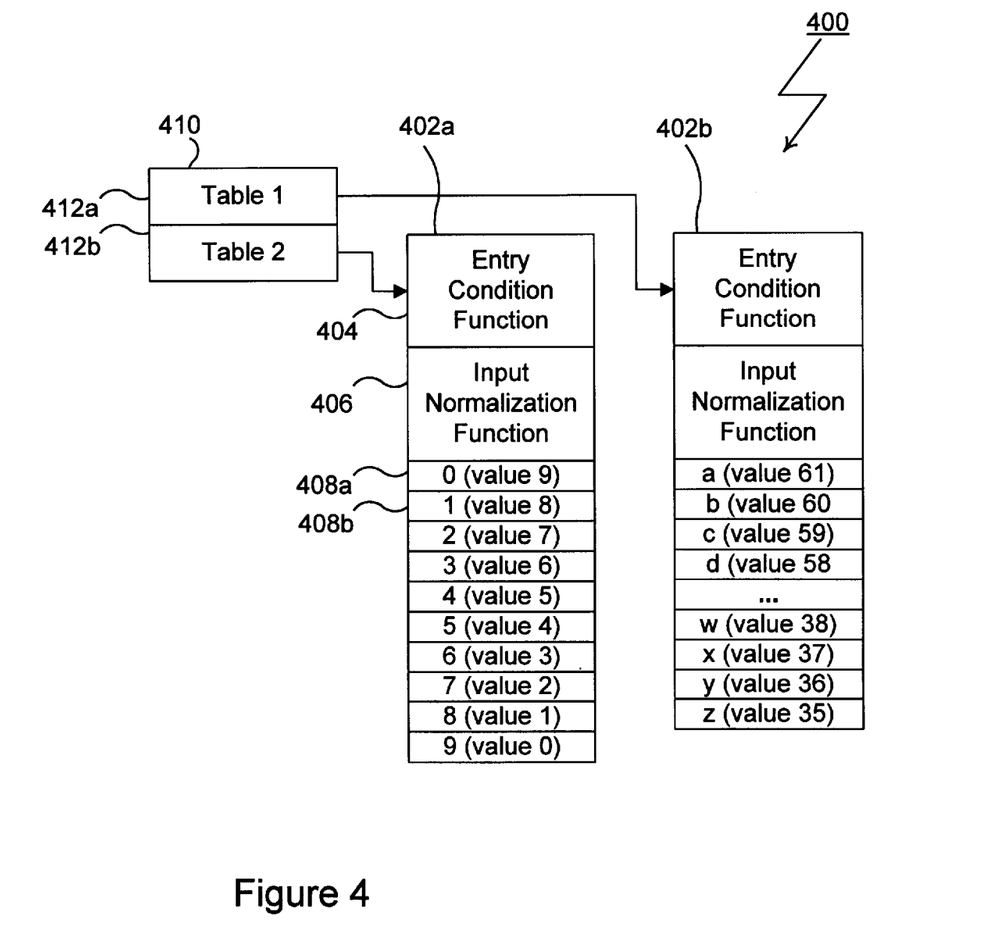
FIG. 4 is a drawing of a list of translation tables as used by the embodiment of FIG. 1.

In FIG. 4, the apparatus used by the described embodiment of the present invention to translate between the source codeset 200 and target codeset is shown and generally designated 400. Apparatus 400 includes two translation tables 402a and 402b which correspond to the two distinct sequences defined by source codeset 200 and target codeset 300 (i.e. the distinct sequence of decimal digits and the distinct sequence of lowercase letters). Each translation table includes an entry condition function 404 and an input normalization function 406. Additionally, each translation table includes a series of entries, of which entry 408a and 408b are representative.

FIG. 4 also shows that the apparatus 400 includes a translation table list 410 having an entry 412 for each translation table 402. Functionally, translation table list 410 is intended to allow each translation table 402 to be accessed in sequence. For the purposes of the present invention, a range of differing implementations are possible for translation table list 410. For example, it would be equally practical to replace translation table list 410 with a linked list where each translation table 402 includes a pointer to the next translation table 402.

Each entry 408 within each translation table 402 represents a translation from a character in the source codeset 200 to a character in the target codeset 300. For example, entry 408a in translation table 402a represents a translation from the character '0' in the source codeset 200 to the character '0' in the target codeset 300. Similarly, entry 408b in translation table 402a represents a translation from the character '1' in the source codeset 200 to the character '1' in the target codeset 300 (it should be remembered that the characters '0' and '1' differ between the source codeset 200 and the target codeset 300 because each character has a different ordinal value in the source codeset 200 and target codeset 300). Each entry 408 in translation table 402a is accessible by a particular character in the source codeset 200. When accessed, each entry 408 contains the character from the target codeset 300 that is the translation for the particular character in the source codeset 200. For example, entry 408a may be accessed using the character '0' from the source codeset 200 and contains the translated character '0' from the target codeset 300.

To make each entry 408 accessible by a particular character in the source codeset 200, the entries 408 are arranged in the order of the ordinal values of the characters in the source codeset 200. For this reason, the entries in translation table 402a are arranged as '0', '1', '2', . . . . By arranging the entries 408 in the order of the ordinal values of the source codeset 200, the translation table entry 408 for a particular input character may be accessed using the input normalization function 406 which, as discussed with greater particularity in following sections, returns an index based on the ordinal value of the input character.

Figure 5:
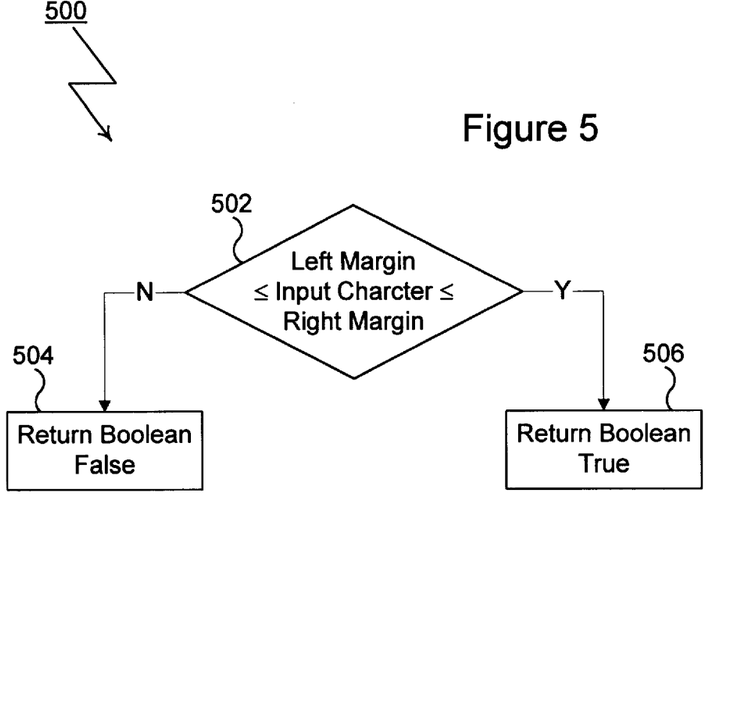
FIG. 5 is a flowchart of the steps associated with the entry condition function of the described embodiment.

As shown in FIG. 4, each translation table 402 includes an entry condition function 404. The entry condition function 404 accepts an input character, from the source codeset, such as source codeset 200, and returns a boolean value of true if a translation exists for the input character in the translation table 402 associated with the entry condition function 404. If, on the other hand, no translation exists, a boolean value of false is returned. The preferred method associated with the entry condition function 404 is shown in FIG. 5 and generally designated 500. In more detail, it may be seen that method 500 begins with step 502 where the input character is compared to a right margin and a left margin. The right margin is the ordinal value of the last character for which a translation exists in the translation table 402. Similarly, the left margin is the ordinal value of the first character for which a translation exists in the translation table 402. If the input character is found to be equal to, or within the left margin or right margin, a boolean value of true is returned in step 506. Alternatively, if the input character exceeds the right margin, or is less than the left margin, a boolean value of false is returned in step 504.

Figure 6:
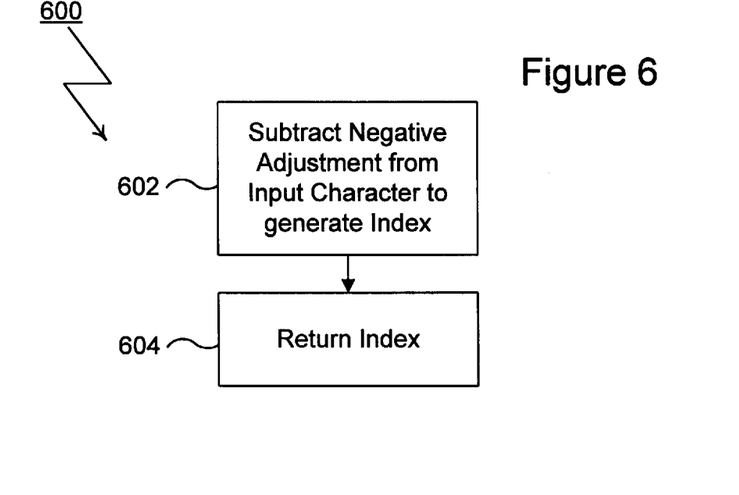
FIG. 6 is a flowchart of the steps associated with the input normalization function of the described embodiment.

As also shown in FIG. 4, each translation table 402 includes an input normalization function 406. The input normalization function 406 accepts an input character from the source codeset 200 and returns an index value which corresponds to the position of the translation of the input character in the translation table 402. The preferred method for input normalization function 406 is shown in FIG. 6 and generally designated 600. Method 600 begins with step 602 where an index is generated by subtracting an integer negative adjustment from the input character. For each translation table 402, the negative adjustment is defined to be the ordinal value of the character in the source codeset 200 which corresponds to the first entry 408 of the translation table 402. For example, in the case of translation table 402a, the negative adjustment is defined to be the ordinal value of the character '0'. Similarly, for translation table 402b, the negative adjustment is defined to be the ordinal value of the character 'a'. As an example of index generation, assume that the input character '1' is passed to the input normalization function 406 for the translation table 402a. In this case, the ordinal value for '0' is subtracted from the ordinal value for '1' generating an index of one. Index one corresponds to entry 408b which contains the character '1' which is the translation for the input character '1'. The index generated in step 602 is returned in step 604.

The present invention specifically incorporates an article of manufacture, which is a computer readable medium such as a floppy disk, optical disk, or hard drive, etc., storing the apparatus described in the preceding paragraphs with reference to FIGS. 1 though 6.

Figure 7:
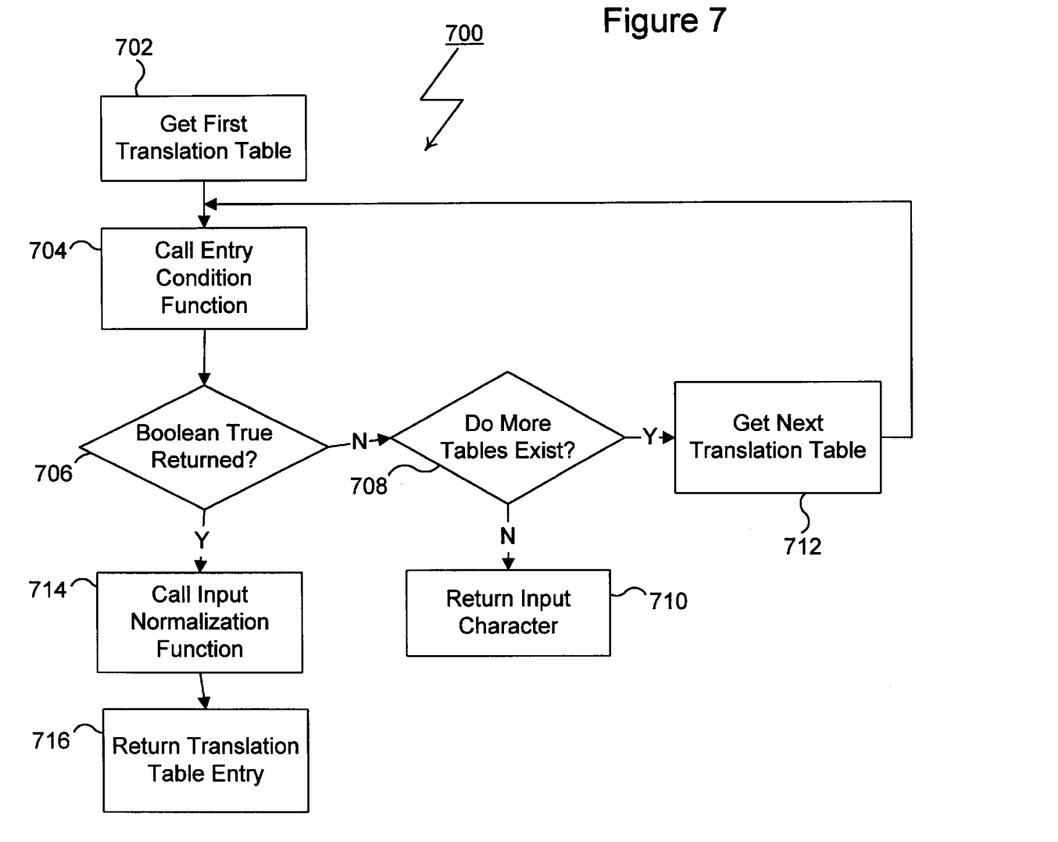
FIG. 7 is a flowchart of the steps associated with the translation of an input character between a source codeset and a target codeset.

The method for translating a source character from source codeset to a target codeset, using the apparatus 400 as described in the preceding paragraphs, is shown in FIG. 7 and generally designated 700. In a preferred embodiment of the present invention, the steps of method 700 are performed by the processor 104 executing translation routines 116 in memory 106. Method 700 begins with step 702 which represents access of the translation table list 410 to access the first translation table 402a. Once the first translation table 402a has been accessed, the following step, step 704, calls the entry condition function 404 associated with the translation table 402a. The parameter passed to the entry condition function 404 is the input character that is to be translated.

In the following step, step 706, the return value from the entry condition function is tested. If the entry condition function returns a boolean value of true, execution continues at step 714. In the alternative, i.e. when the entry condition function returns false, execution continues at step 708. Turning initially to the second alternative, it may be seen that a return of boolean false is followed by a test in step 708 to determine whether additional translation tables remain to be processed. This step can be performed by testing for a null value at the end of the list 410 or other method well known to one familiar with the pertinent art.

When step 708 indicates that no more translation tables 402 are in translation table list 410, execution of the method 700 continues at step 710 where the input character is returned as the translated character. Returning the input character is a logical result because, as previously discussed, the characters included in the translation tables 402 are characters which are found in the distinct sequences defined by source codeset 200 and target codeset 300. If no translation is found for an input character, the input character must be a character which is found in a common sequence. Since characters in common sequences are the same in the source codeset 200 and target codeset 300 no translation is required.

In the alternative, when step 708 indicates that translation tables 402 remain in translation table list 410, execution continues at step 712 where the next translation table 402 in translation table list 410 is selected. Based on the foregoing, it may be appreciated that the steps 704 though 712 represent a loop which traverses the translation table list 410 until either an entry condition function 404 returns a value of true for the input character or the end of the translation table list 410 is reached.

In step 714, which follows the loop of steps 704 though 712, the input character is passed to the input normalization function 406. As described above, the input normalization function 406 returns an index into the translation table 402 based on the input character. In the following step, the entry 408 in the translation table 402 which is indexed by the value returned by the input normalization function 406 is returned as the translation of the input character.

As described above, the present invention provides a method and apparatus to translate an input character from a source codeset 200 to a target codeset 300. In should be appreciated that there will be occasions where several instances of the present invention will exist which provide translations between a number of differing source codesets and a number of differing target codesets. In such cases, the method of the present invention may be utilized iteratively to translate a character from a source codeset to one or more intermediate codesets and finally to a target codeset. This allows a translation of an input character to occur even when no instance of the present invention provides a translation from the particular source codeset to the particular target codeset. The present invention may also be utilized to provide translations from a set of source codesets to a universal codeset and a set of translations from the universal codeset to a set of target codesets. In this way, a large number of distinct translations may be accommodated with a limited number of instances of the present invention. The present invention is also specifically intended to be used within a centralized translation system, allowing different procedures within the same system to share a common translation facility. In this way, the present invention may be used to reduce memory usage as well as reducing duplicative programming effort.

The present invention specifically incorporates an article of manufacture, which is a computer readable medium such as a floppy disk, optical disk, or hard drive, etc., storing the method 700 for translating an input character described in the preceding paragraphs with reference to FIG. 7.

Figure 8:
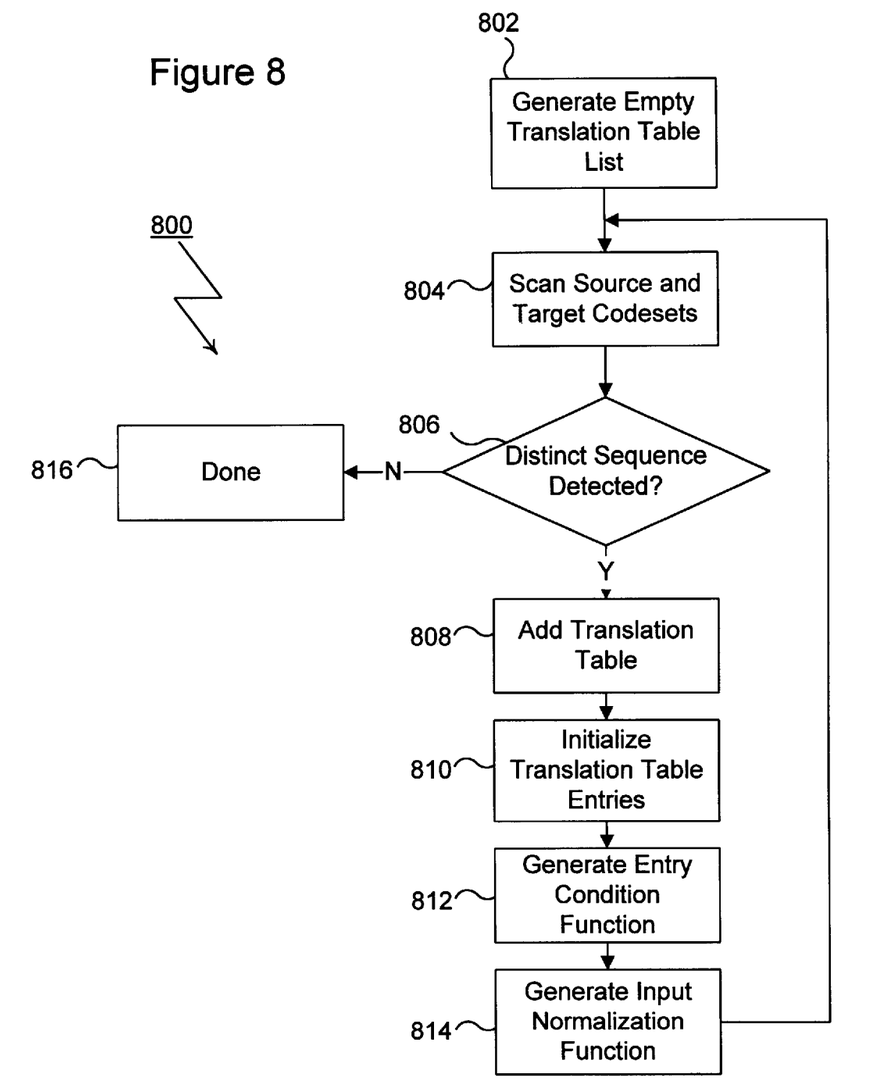
FIG. 8 is a flowchart of the steps associated with the creation of a list of translation tables as utilized by the described embodiment.

A method for creation of the apparatus 400 is shown in FIG. 8 and generally designated 800. In a preferred embodiment of the present invention, the steps of method 800 are performed by the processor 104 executing translation routines 116 in memory 106. Method 800 begins with step 802 which represents creation of an empty translation table list 410. Next, in step 804, the source codeset 200 and the target codeset 300 are scanned for distinct character sequences. This may generally be performed by scanning the source codeset 200 and target codeset 300 for sequences where each character in the source codeset 200 differs from the character located at the same ordinal position in the target codeset 300.

Assuming that a distinct character sequence is detected, step 806 passes control to step 808 where a new translation table is allocated. This new translation table is logically associated with the distinct sequence detected in step 804. Next in step 810, each entry 408 within the translation table 402 created in step 808 is initialized. Specifically, each entry 408 is initialized so that the translation table 402 contains, in order, each character from the target codeset 300 from the distinct character sequence associated with the translation table 402 created in step 808.

Following initialization of the translation table 402, an entry condition function 404 is created in step 812. In general, creation of this function is performed by generating appropriate values for the left margin and right margin described previously. Once generated, these values may be applied to a predefined code sequence which performs the steps shown in FIG. 5 for method 500.

Generation of the entry condition function 404 is followed by generation of the input normalization function 406 in step 814. Creation of the input normalization function 406 is similar to the creation of the entry condition function 404 and is generally performed by generating an appropriate value for the negative adjustment. The negative adjustment and the value for the integer bit mask generated in step 812 may then be applied to a predefined code sequence which performs the steps shown in FIG. 6 for method 600.

Control then returns to step 804 where the source codeset 200 and target codeset 300 are once again scanned for distinct sequences of characters. Thus, the loop consisting of steps 804 through 814 is repeated until no more distinct sequences remain and execution terminates at step 816.

The present invention specifically incorporates an article of manufacture, which is a computer readable medium such as a floppy disk, optical disk, or hard drive, etc., storing the method described in the preceding paragraphs with reference to FIG. 8.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A method for providing a translation system between a source codeset and a target codeset stored in a memory of a computer system, the method comprising the steps, performed by the computer system, of:

identifying at least one sequence of characters within the source codeset, each character in the sequence having a corresponding translated character in the target codeset with the character and the translated character being distinct;

providing a translation table for each sequence, the translation table having one entry for each character in the sequence, each entry containing a translated character which corresponds to a character in the sequence with the entries being arranged in the same order as the characters in the sequence; and providing an input normalization function for each translation table, the input normalization function accepting an input character from the source codeset as a parameter, the input normalization function returning the index within the translation table of the entry which contains the translation of the input character.

2. A method as recited in claim 1 further comprising the step of providing an entry condition function for each translation table, the entry condition function accepting an input character from the source codeset as a parameter, the input function returning a boolean value of true only if the input character may be found within the sequence.

3. A method as recited in claim 1 further comprising the step of providing a list, the list having one entry for each translation table, the list being usable to sequentially access each translation table, each entry condition function and each input normalization function.

4. A method as recited in claim 2 further comprising the steps of:

provided an integer negative adjustment for the translation table, the negative adjustment used by the entry condition function and the input normalization function;

providing an integer left margin for the translation table, the left margin used by the entry condition function; and providing an integer right margin for the translation table, the right margin used by the entry condition function.

5. A method for providing a translation system between a source codeset and a target codeset stored in a memory of a computer system, the method comprising the steps, performed by the computer system, of:

providing a list of translation tables, each translation table having one or more entries, each entry mapping one character in the source codeset to the translated character in the target codeset;

providing an entry condition function for each translation table, the entry condition function accepting an input character in the source code set as a parameter and returning a boolean value of true if the table contains a translation for the input character; and providing an input normalization function for each translation table, the input normalization function accepting an input character in the source code set as a parameter and returning the index within the translation table of the entry which contains the translation of the input character.

6. A method as recited in claim 5 wherein the input normalization function includes the steps of:

accessing a translation table in the list of translation tables;

calling the entry condition function of the accessed translation table;

conditionally calling the input normalization function of the accessed translation table to generate an index if the entry condition function returns a boolean true; and conditionally using the index to return an entry of the accessed translation table if the entry condition function returns a boolean true.

7. A method as recited in claim 6 wherein the steps of accessing a translation table, calling the entry condition function, conditionally calling the input normalization function, and conditionally using the index are repeated until the step of calling the entry condition function returns a boolean true or until each table in the list of translation tables has been accessed.

8. A method as recited in claim 7 further comprising the step of conditionally returning the input character if each table in the list of translation tables has been accessed without the step of calling the entry condition function returning a boolean true.

9. A method as recited in claim 5 wherein each translation table includes an integer negative adjustment, an integer left margin and an integer right margin.

10. A method as recited in claim 9 wherein the input normalization function includes the steps of:

subtracting the negative adjustment from the input character to generate an index value; and returning the index value.

11. A method as recited in claim 9 wherein the entry condition function includes the step of returning a boolean true value only if the input character is less than or equal to the right margin and greater than or equal to the left margin.

12. A method as recited in claim 5 wherein the steps of providing a list of translation tables, traversing the list of translation tables, calling the input normalization function, and returning the translated character are repeated one or more times to translate an input character from a source codeset to one or more intermediate codesets followed by translation to the target codeset.

13. A computer program product comprising:

a computer usable medium having computer readable code embodied therein for translating an input character from a source codeset to a target codeset, the computer program product comprising:

computer readable program code devices configured as a list of translation tables, each translation table having one or more entries, each entry mapping one character in the source codeset to the translated character in the target codeset;

computer readable program code devices configured to return a value of boolean true if a translation table includes an entry containing a translation for the input character; and computer readable program code devices configured to generate the index of a translation table entry which contains a translation for the input character.

14. A computer program product as recited in claim 13 further comprising computer readable program code devices configured to traverse the list of translation tables.

15. A computer program product as recited in claim 13 wherein each translation table includes an integer negative adjustment, an integer left margin and an integer right margin.

16. A computer program product as recited in claim 15 wherein the computer readable program code devices configured to generate the index of a translation table entry further comprises:

computer readable program code devices configured to subtract the negative adjustment from the input character to generate an index value; and computer readable program code devices configured to return the index value.

17. A computer program product as recited in claim 15 wherein the computer readable program code devices configured to return a value of boolean true further comprise computer readable program code devices configured to return a boolean true value only if the input character is less than or equal to the right margin and greater than or equal to the left margin.

18. An apparatus for translating between a source codeset and a target codeset stored in a memory of a computer system, the apparatus comprising:

at least one translation table, each translation table being associated with a distinct sequence in the source and target codesets, each translation table having one or more entries, each entry mapping one character in the source codeset to the translated character in the target codeset;

an entry condition function for each translation table, the entry condition function being executable by the computer system and accepting an input character in the source code set as a parameter, the entry condition function returning a boolean value of true if the table contains a translation for the input character; and an input normalization function for each translation table, the input normalization function being executable by the computer system and accepting an input character in the source code set as a parameter, the input normalization function returning the index within the translation table of the entry which contains the translation of the input character.

19. An apparatus as recited in claim 18 further comprising a list stored in the memory of the computer system, the list including one entry for each translation table.

* * * * *